(12) United States Patent  
Cheng et al.

(10) Patent No.: US 8,293,548 B2  
(45) Date of Patent: Oct. 23, 2012

(54) LED LIGHT MODULE FOR STREET LAMP AND METHOD OF MANUFACTURING SAME

(75) Inventors: Junming Cheng, Guangdong (CN); Guangming Zeng, Guangdong (CN); Yuefei Wang, Guangdong (CN)

(73) Assignee: Unilumin Group Co., Ltd., Guangdong (CN)

( * ) Notice: Subject to any disclaimer, the term of this patent is extended or adjusted under 35 U.S.C. 154(b) by 312 days.

(21) Appl. No.: 12/717,087

(22) Filed: Mar. 3, 2010

(65) Prior Publication Data

US 2010/0226130 A1    Sep. 9, 2010

Related U.S. Application Data

(63) Continuation-in-part of application No. PCT/CN2009/072151, filed on Jun. 5, 2009.

(30) Foreign Application Priority Data

Mar. 4, 2009 (CN) .......................... 2009 1 0105690

(51) Int. Cl.
    *H01L 21/50* (2006.01)
(52) U.S. Cl. ..... 438/27; 438/29; 438/127; 257/E21.504; 257/E21.499
(58) Field of Classification Search .............. 438/26, 438/27, 29, 127; 257/E21.504, E21.499
    See application file for complete search history.

(56) References Cited

U.S. PATENT DOCUMENTS

| | | | | |
|---|---|---|---|---|
| 3,774,021 A * | 11/1973 | Johnson | ............... | 362/27 |
| 4,733,338 A * | 3/1988 | Feher et al. | ............... | 362/310 |
| 5,013,144 A * | 5/1991 | Silverglate et al. | ............... | 359/709 |
| 6,674,096 B2 * | 1/2004 | Sommers | ............... | 257/98 |
| 7,128,454 B2 * | 10/2006 | Kim et al. | ............... | 362/507 |
| 7,153,002 B2 * | 12/2006 | Kim et al. | ............... | 362/327 |
| 7,244,924 B2 * | 7/2007 | Kiyomoto et al. | ............... | 250/216 |
| 7,300,183 B2 * | 11/2007 | Kiyomoto et al. | ............... | 362/297 |
| 7,339,200 B2 * | 3/2008 | Amano et al. | ............... | 257/98 |
| 7,348,723 B2 * | 3/2008 | Yamaguchi et al. | ............... | 313/501 |
| 7,390,109 B2 * | 6/2008 | Li et al. | ............... | 362/296.07 |
| 7,582,913 B2 * | 9/2009 | Huang et al. | ............... | 257/98 |
| 7,618,163 B2 * | 11/2009 | Wilcox | ............... | 362/336 |
| 7,674,018 B2 * | 3/2010 | Holder et al. | ............... | 362/311.06 |
| 7,781,787 B2 * | 8/2010 | Suehiro et al. | ............... | 257/98 |
| 7,841,750 B2 * | 11/2010 | Wilcox et al. | ............... | 362/334 |
| 7,880,188 B2 * | 2/2011 | Blumel et al. | ............... | 257/98 |
| 7,907,845 B2 * | 3/2011 | Yasumoto et al. | ............... | 398/135 |
| 7,977,699 B2 * | 7/2011 | Park et al. | ............... | 257/99 |

(Continued)

FOREIGN PATENT DOCUMENTS

WO    WO 2008/122941    * 10/2008

(Continued)

*Primary Examiner* — Mary Wilczewski

(57) ABSTRACT

An LED light module (100) for street lamp includes a frame (1), electrodes (5) and a heat sink (4) mounted in the frame, an LED chip (2) attached on a top of the heat sink; and a silicon lens (3) formed on the frame and closely sealing the LED chip therein. The LED light module is an integral structure with the silicon lens being formed thereon through an in-mold process. The silicon lens lengthwise includes two convergent parts (31, 33) at either end and a depressed part (32) at middle thereof for consecutively bridging the two convergent parts. Thus the exit light beam from the LED light module is elongated without light loss. A one-body molding process for manufacturing the LED light module is disclosed as well, which is in high-efficiency, and adapted for a mass production.

11 Claims, 4 Drawing Sheets

U.S. PATENT DOCUMENTS

| | | | | |
|---|---|---|---|---|
| 7,998,765 B2* | 8/2011 | Liang et al. | | 438/26 |
| 8,109,658 B2* | 2/2012 | Matsuki et al. | | 362/311.02 |
| 8,147,100 B2* | 4/2012 | Yamaguchi | | 362/311.02 |
| 8,172,433 B2* | 5/2012 | Muschaweck | | 362/335 |
| 8,178,894 B2* | 5/2012 | Park et al. | | 257/99 |
| 8,215,814 B2* | 7/2012 | Marcoux | | 362/555 |
| 8,220,958 B2* | 7/2012 | Montagne | | 362/235 |
| 2002/0037143 A1* | 3/2002 | Kuhara et al. | | 385/94 |
| 2004/0037076 A1* | 2/2004 | Katoh et al. | | 362/235 |
| 2004/0170018 A1* | 9/2004 | Nawashiro | | 362/244 |
| 2004/0207999 A1* | 10/2004 | Suehiro et al. | | 362/84 |
| 2006/0138437 A1* | 6/2006 | Huang et al. | | 257/98 |
| 2008/0013322 A1* | 1/2008 | Ohkawa | | 362/311 |
| 2009/0014913 A1* | 1/2009 | Lin et al. | | 264/317 |
| 2010/0073937 A1* | 3/2010 | Ho | | 362/335 |
| 2010/0118531 A1* | 5/2010 | Montagne | | 362/235 |
| 2010/0128488 A1* | 5/2010 | Marcoux | | 362/311.02 |
| 2010/0226130 A1* | 9/2010 | Cheng et al. | | 362/294 |
| 2011/0175119 A1* | 7/2011 | Kim et al. | | 257/91 |
| 2012/0113621 A1* | 5/2012 | Lee et al. | | 362/97.1 |

FOREIGN PATENT DOCUMENTS

WO    WO 2010/107239    *    9/2010

* cited by examiner

LED LIGHT MODULE FOR STREET LAMP AND METHOD OF MANUFACTURING SAME

BACKGROUND OF THE INVENTION

The present patent document is a continuation-in-part of PCT international application No. PCT/CN2009/072151 filed on Jun. 5, 2009, the entire content of which are hereby incorporated herein by reference.

The present invention relates to an LED light module and method of manufacturing the same, and especially to an LED light module for street lamp with elongated light beam and a method of manufacturing the same.

A known LED light module as described in Chinese Pat. No. ZL200710030627.1 to Fan includes a base for fixing electrodes and a heat sink. The heat sink supports an LED chip thereon. A transparent cover is substantially in a shape of hemisphere, and is secured over the base so as to shield the LED chip therein. However, when Fan's LED light module is used for street lamp, the exit light beam has a round periphery. This means that the peripheral light beam will intercept a smaller road surface. The maximum distance between two consecutive street luminaries is limited, and the light uniformity and intensity is poor. Usually, an additional reflector or light-beam shaper is necessary to be provided to the luminary head, across the light path, in order to direct the light beam with an appropriate angle, towards the street. It is complex, inconvenient, and costly for using the additional reflector. Fan also discloses a method of manufacturing the transparent cover. However, the method is completely a manual operation, thus it is in very poor efficiency.

A known light-beam shaper in the art as one described in international publication No.: WO2008/122941 to Louis. The Louis's light-beam shaper comprises an entry diopter, an exit diopter, and a base surface. The exit diopter includes a first convergent section, a second convergent section and a divergent section bridging the first and second convergent sections. The light-beam shaper is mounted over the LED for redistributing the light flux, and the redistribution results in an elongate light beam with symmetrical light distribution lengthwise. However, the LED device has some disadvantages. Firstly, Louis's light-beam shaper is an extra component for an LED device, which is costly and complex structure. Secondly, Louis's light-beam shaper is not an integral structure for the LED device, and an undesirable space exists between the LED and the shaper. As a result, dust, water, ice, snow or the like will easily enter from the space and the base surface to destroy the LED. Especially when it is necessary to solder the LED device onto the PCBA, solder and heat will enter from the space to destroy the LED. Thirdly, the entry diopter is a convex, which defines an inner space for lodging the LED. Light beam exited from LED passes through the space, then from the entry diopter to the exit diopter, which will result in light loss in the space and the entry diopter. Furthermore, some light beam will leak out from the base surface, which results in light loss and light pollution. Finally, the light-beam shaper is made from polymethacrylate, the melting point of which is relatively low, it is not applicable for the soldering process of LED device to the PCBA since heat or solder will destroy the light beam shaper.

Therefore, an improved LED light module for street lamp is desired which overcomes the disadvantages of the prior art.

BRIEF SUMMARY OF THE INVENTION

A main object of the present invention is to provide an LED light module in an integral and simple structure, of which exit light beam is elongated without light loss, the maximum distance between two consecutive street luminaries is increased, and the light uniformity and intensity is strong; and specially, the LED light module of the present invention is applicable for an automatic soldering process when a large number of LED light modules are soldered to PCBA.

Another object of the present invention is to provide a method of manufacturing the LED light module, which is in high-efficiency.

To obtain the above objects, an LED light module for street lamp in the present invention comprises a frame, electrodes intersecting the frame, a heat sink mounted in the frame, an LED chip attached on a top of the heat sink, and a silicon lens formed on the frame and closely sealing the LED chip therein. Wherein the LED light module is an integral structure with the silicon lens being formed thereon through an in-mold process. The LED lens is made from silicon resin and is substantially in a shape of peanut, which lengthwise comprises two convergent parts at either end and a depressed part at middle thereof for consecutively bridging two convergent parts. Thereby, the exit light beam from the LED light module is elongated, in a shape of rectangular or elliptic periphery according to different lengths of the convergent parts and depressed part, and a distribution curve flux of which is in a batwing-shape. The maximum distance between two consecutive street luminaries is longer than round light beam, and the light uniformity and intensity is stronger as well. The silicon lens is intimately engaged with a surface of the LED chip, and no space exits therebetween for avoiding light loss. The LED light module of the present invention is applicable for a soldering process when a large number of LED light modules are soldered to PCBA.

In a preferable embodiment, the two convergent parts are substantially shaped of a quarter sphere, and the depressed part is substantially in a shape of cylinder. A diameter of the cylindrical depressed part is lower than that of the convergent parts, therefore, the LED light module is higher at either end and is lower at middle.

The silicon lens is preferably made from liquid silicon resin, such as phenyl silicone or methyl silicone. Herein, a Hardness Durometer A of the silicon resin is at a range of 50-80, a Hardness Shore D is at a range of 10-70, refractive index is at a range of 1.4-1.6, a viscosity of mix at 25 degree Celsius is at a range of 1000-7000 mPas, and a light transmittance at 400 per 2 mm is more than 90 percent.

To obtain the above objects, a method of manufacturing the LED light module comprises steps of:

(1) providing a frame with electrodes and the heat sink being secured therein, and an LED chip being attached onto a top of the heat sink, therefore the frame being assembled;

(2) preheating the frame;

(3) forming a silicon lens on the assembled frame through an in-mold process so as to obtain an LED light module; and (4) releasing the LED light module from the mold and further baking the same.

Herein, at the step of (3), the frame is mounted in a mold with the LED chip upward to a cavity of the mold. The mold is designed with the cavity in a shape of peanut. Silicon resin and preferably liquid silicon resin is injected into and filled in the cavity of the mold. Thereafter, the mold is heated to a temperature of 120-160 degree Celsius for 5-30 minutes, and the silicon resin is cured to form a silicon lens on the frame. Hereinto, the silicon lens in a shape of peanut is intimately engaged with a surface of the LED chip and seals the LED chip on the top of the heat sink.

At the step of (2), the frame is heated for 1-5 hours at a temperature of 100-160 degree Celsius. At the step of (4), the LED light module is baked in an oven for 1-5 hours at a temperature of 120-160 degree Celsius.

In another embodiment, at the step of (3), a die template is used, which has a plurality of mold in a shape of peanut. A plurality of the assembled frames is secured into the die template, while each mold covers on one frame with the LED chip upward into the cavity. The die template is grasped using a holder. Silicon resin is pressed into and fully filled in each mold at a pressure of 0.1-0.6 Mpa. And at the step of (4), the die template is put in a baker together with the assembled frame 1 and is heated to a temperature of 100-160 degree Celsius for 1-3 hours. Then release the LED module from the holder and die template, and heat the same at a temperature of 120-160 degree Celsius for 1-5 hours, and the LED light module is finally obtained.

The method of manufacturing the LED light module of the present invention is adapted to mass production and automatic machine operations, which is in high-efficiency.

Other objects, advantages and novel features of the invention will become more apparent from the following detailed description of a preferred embodiment thereof when taken in conjunction with the accompanying drawings, wherein:

DETAILED DESCRIPTION OF THE INVENTION

Figure 1:
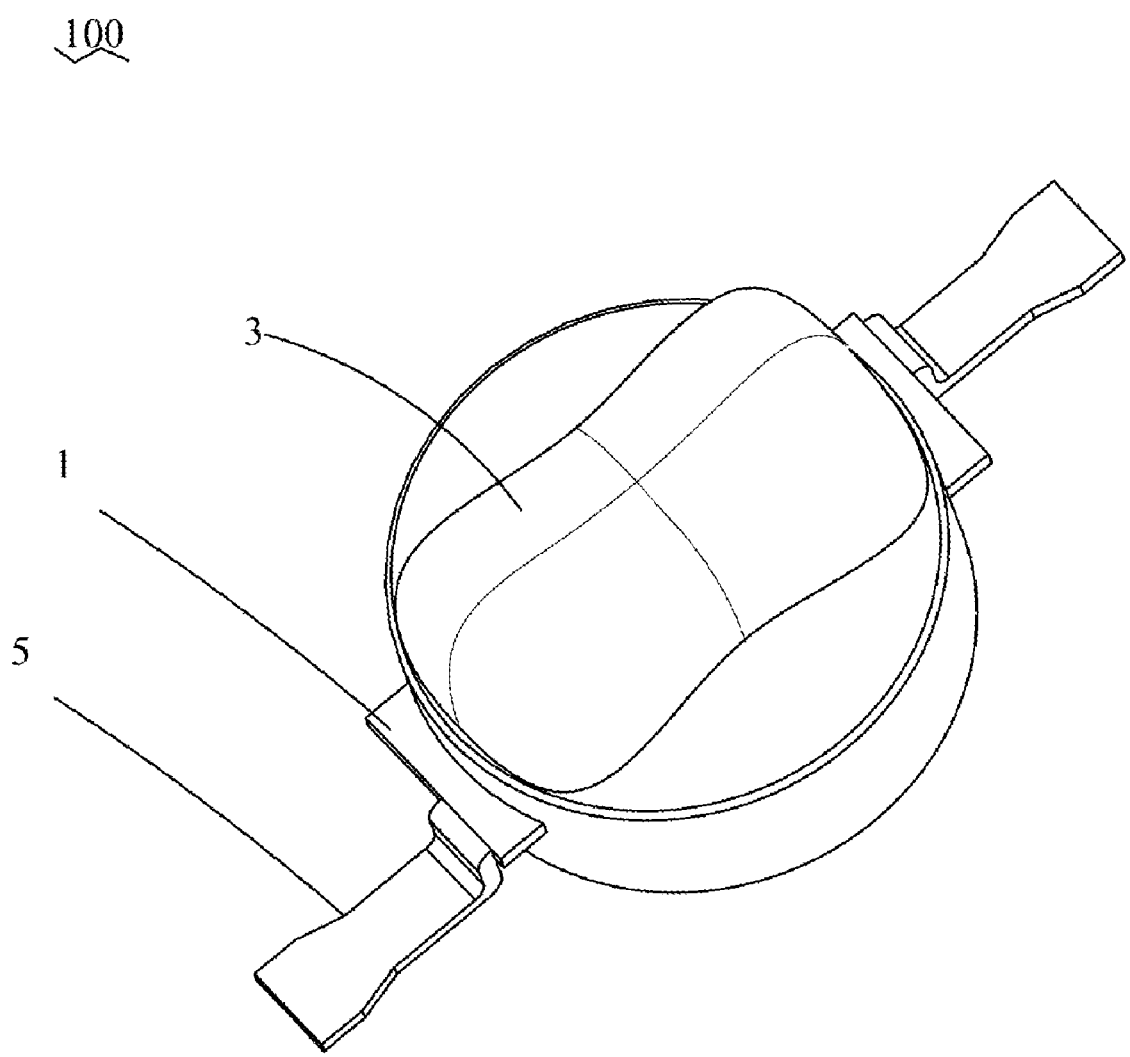
FIG. 1 is a perspective view of an LED light module in accordance with an embodiment of the present invention.
Figure 2:
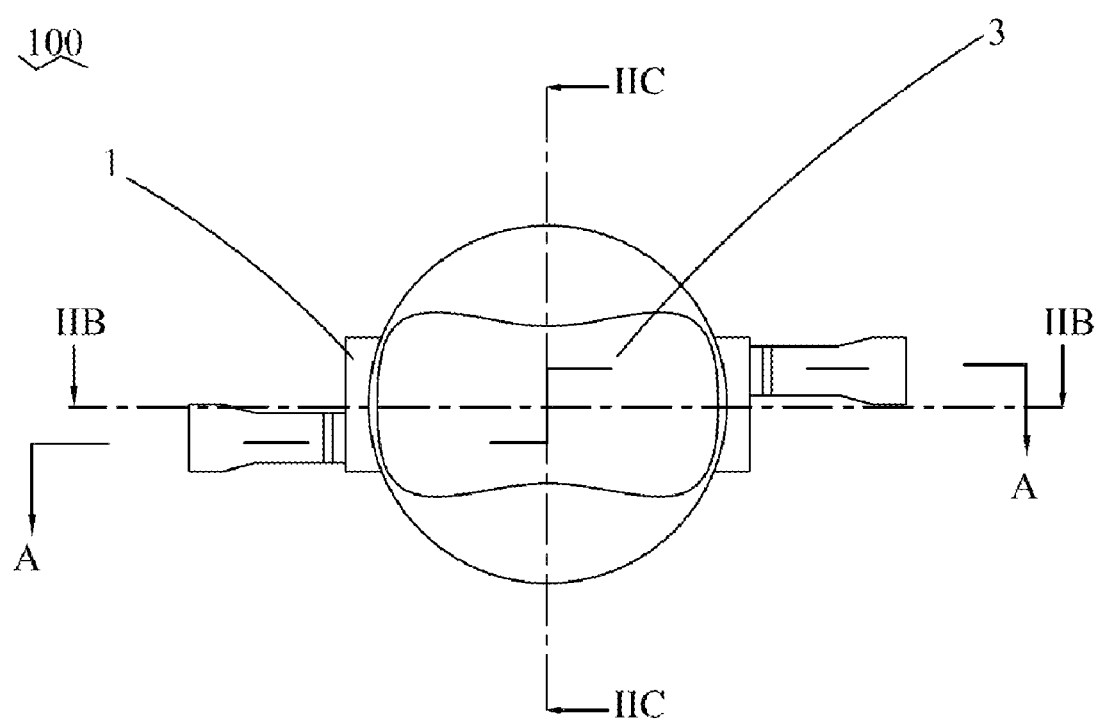
FIG. 2 is a top view of the LED light module in accordance with an embodiment of the present invention.
Figure 3:
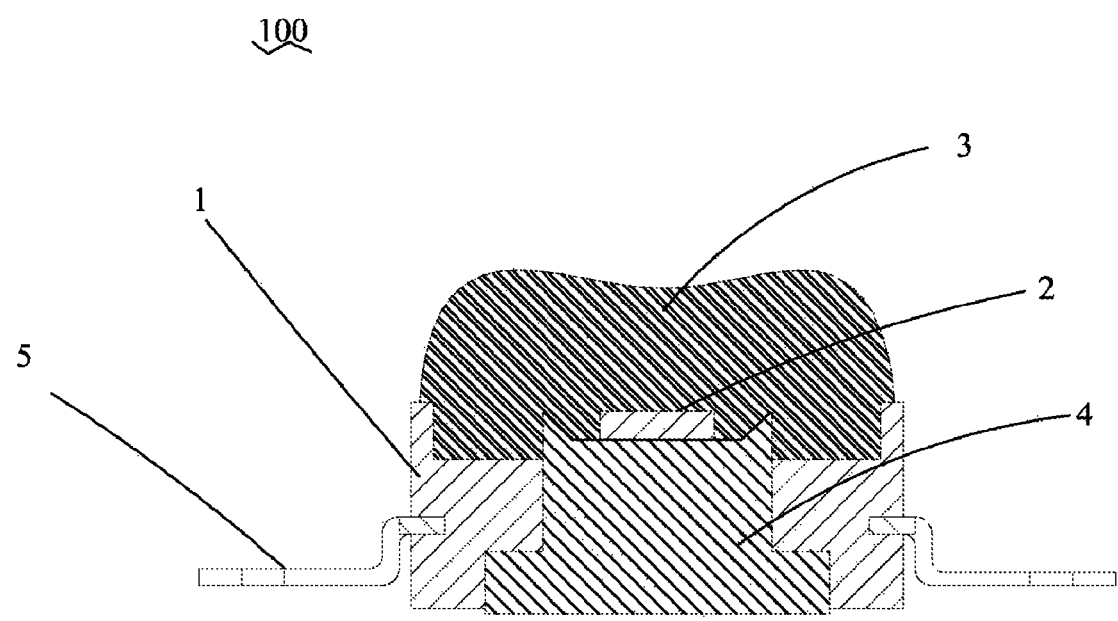
FIG. 3 is a cross-sectional view along line A-A of FIG. 2.

Referring to FIGS. 1 to 3, an LED light module 100 according to the embodiment of the present invention includes a frame 1, an LED chip 2, a silicon lens 3, a heat sink 4, and electrodes 5. The frame 1 is preferably in a shape of cylinder. The heat sink 4 is mounted in the frame 1, and preferably located at the middle of the frame 1. The electrodes 5 are secured across the frame 1. The LED chip 2 is supported on the top of the heat sink 4, and is desirably surrounded with fluorescence powder on the surface thereof. The heat sink 4 is used for dissipating heat generated by the LED chip 2.

The silicon lens 3 is made from solid or liquid silicon resin, preferably from liquid silicon resin, such as phenyl silicone or methyl silicone. The silicon lens 3 is formed on the frame 1 as an integral structure through a one-body molding process, and closely seals the LED chip 2 therein. The lens 3 is intimately engaged with the surface of the LED chip 2. Hereby, light is generated from the LED chip 2 and directly passes through the lens 3 without loss of light beam, and the lens 3 can shield the LED chip 2 from dust, heat, snow, water, ice and so on. Moreover, the silicon resin has a relatively high melting temperature. Accordingly, the LED light module 100 is applicable for an automatic soldering process, such as a reflow soldering process, when lots of LED modules 100 are soldered onto PCBA. Herein, the LED chip 3 is protected from heat or flowing solder by the silicon lens 3.

The silicon lens 3 is substantially in a shape of peanut, and is preferably symmetric along two center perpendicular lines IIB and IIC. The silicon lens 3 lengthwise comprises three parts 31, 32, 33. That is first and second convergent parts 31, 33 at either ends, and depressed part 32 as a bridge of the two convergent parts 31, 33. In a preferable embodiment, the two convergent parts 31, 33 are substantially in a shape of a quarter sphere, and the depressed part 32 is substantially in a shape of cylinder. The diameter of the cylinder is lower than that of the quarter sphere, so that the convergent part at either end is higher than depressed part 32 at the middle of the lens 3, which forms the shape of peanut. The diameters of the two convergent parts are the same or not. The light beam emitted from the LED chip 2 is redistributed through the silicone lens 3 without light loss, and then forms an elongate light beam with a symmetrical light distribution lengthwise instead of round light beam, which allows for a better lighting of a road section, stronger density and intensity. The silicon lens 3 is the only cover of the LED chip 2, and can directly impart the exit light beam in an elongated illumination, such as in a rectangular, elliptic periphery or the like according to different lengths of the three parts 31, 32, 33, the distribution curve flux of which is in a batwing-shape. The maximum distance between two consecutive street luminaries is longer than the round light beam, and the light uniformity and intensity is stronger as well. Any additional reflector or light-beam shaper is no longer necessary for the LED light module 100 of the present invention.

The method of manufacturing of the LED light module 100 of the present invention comprises the steps of:

(1) providing the frame 1 in which electrodes 5 and the heat sink 4 is secured, and the LED chip 2 being attached onto the top of the heat sink 4, therefore the frame 1 being assembled;

(2) preheating the frame 1;

(3) forming the silicon lens 3 through an in-mold process (namely one-body molding process) so as to obtain the LED light module 100; and (4) releasing the LED light module 100 from the mold and further baking the same, finally the LED light module 100 of the present invention is obtained.

Herein, at the step of (2), the frame 1 is heated about 1-5 hours at a temperature of 100-160 degree Celsius, and preferably about 2.5 hours at a temperature of 150 degree Celsius.

At the step of (3), the frame 1 is mounted in a mold with the LED chip 2 upward to a cavity of the mold, and the mold is designed according to the shape of lens 3, i.e. the cavity of the mold is in a shape of peanut. Then liquid silicon resin is injected into and filled in the cavity of the mold. Solid silicon resin is applicable as well, while liquid silicon resin is preferable, such as phenyl silicone or methyl silicone. Herein the Hardness Durometer A of the silicon resin is at a range of 50-80, the Hardness Shore D is at a range of 10-70, refractive index is at a range of 1.4-1.6, the viscosity of mix at 25 degree Celsius is at a range of 1000-7000 mPas, and the light transmittance at 400 per 2 mm is more than 90 percent. After the silicon resin is full filled in the cavity of the mold, the mold is heated to a temperature of 120-160 degree Celsius for 5-30 minutes, and preferably at a temperature of 150 degree Celsius for 5 minutes, then the silicon resin is cured so that the lens 3 is formed on the frame 1 and closely seals the LED chip 2 on the top of the heat sink 4.

At the step of (4), the LED light module 100 is baked in an oven for 1-5 hours at a temperature of 120-160 degree Celsius, and preferably for 4 hours at a temperature of 150 degree Celsius, so that the silicon resin is further cured.

Figure 4:
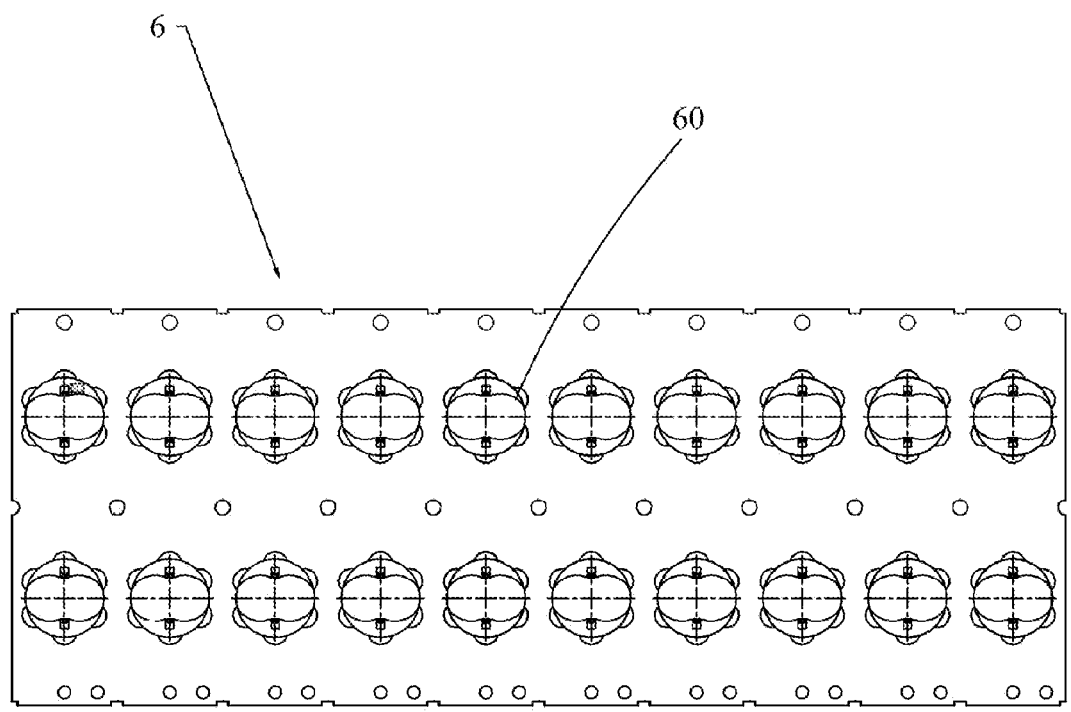
FIG. 4 is a plan view of a die template used in a molding process of the present invention.

In another embodiment, at the step of (3), a die template 6 as shown in FIG. 4 is used in a manual operation. The die template 6 has a plurality of mold 60 in a shape according to the silicon lens 3. Accordingly, a plurality of frame 1 is secured into the die template 6, while each mold 60 covers on one frame 1 with the LED chip 2 upward into the cavity thereof. The die template 6 is grasped by a holder (not shown). The liquid silicon resin is pressed into and fully filled in each mold 60 using a manual dispenser at a pressure of 0.1-0.6 Mpa. At the step of (4), the die template 6 grasped by the holder together with the assembled frame 1, is heated in a baker to a temperature of 100-160 degree Celsius for 1-3 hours, and preferably at a temperature of 120 degree Celsius for 1 hour and then at a temperature of 150 degree Celsius for 1 hour. Then release the LED module 100 from the holder and die template 6, and further heat the same at a temperature of 120-160 degree Celsius for 1-5 hours, preferably at a temperature of 150 degree Celsius for 4 hours. Finally, the LED light module 100 of the present invention is obtained.

The LED light module 100 manufactured using the method of the present invention is an integral structure. The lens 3 substantially in a shape of peanut is formed on the frame 1 and closely seals the LED chip 3 therein on the top of the heat sink 4. The method of the present invention can fast and efficiently produce LED light module 100, which is adapted for mass production and automatic machine operations. The LED light module 100 can be applicable to a solder reflow process when a large quantity of LED light modules 100 are soldered onto the PCBA in mechanized operations, since the lens 3 intimately seals and shields the LED chip 2 therein from solder or heat, and the silicon lens 3 is well resistant to high temperature.

While the invention has been described in conjunction with specific embodiments, it is evident that numerous alternatives, modifications, and variations will be apparent to those skilled in the art in light of the forgoing descriptions. The scope of this invention is defined only by the following claims.

I claim:

1. A method of manufacturing an LED light module comprises steps of:
   (1) providing a frame with electrodes and a heat sink being secured therein, and an LED chip being attached onto a top of the heat sink, thereby the frame being assembled;
   (2) preheating the frame;
   (3) forming a silicon lens on the assembled frame through an in-mold process so as to obtain an LED light module; and
   releasing the LED light module from the mold and further baking the same;
   wherein at the step of (3), the frame is mounted in a mold with the LED chip upward to a cavity of the mold, and the mold is designed with the cavity in a shape of peanut; silicon resin is injected into and filled in the cavity of the mold; thereafter, the mold is heated, thus the silicon resin is cured to form a silicon lens on the frame and seals the LED chip on the top of the heat sink; herein, the silicon lens is in a shape of peanut, and intimately engaged with a surface of the LED chip.

2. The method according to claim 1, wherein at the step of (3), the mold is heated to a temperature of 120-160 degree Celsius for 5-30 minutes, and the silicon resin is liquid.

3. The method according to claim 2, wherein at the step of (3), the mold is heated to a temperature of 150 degree Celsius for 5 minutes.

4. The method according to claim 2, wherein a Hardness Durometer A of the silicon resin is at a range of 50-80, a Hardness Shore D is at a range of 10-70, refractive index is at a range of 1.4-1.6, a viscosity of mix at 25 degree Celsius is at a range of 1000-7000 mPas, and a light transmittance at 400 per 2 mm is more than 90 percent.

5. The method according to claim 4, wherein the liquid silicon resin is phenyl silicone or methyl silicone.

6. The method according to claim 1, wherein at the step of (2), the frame is heated for 1-5 hours at a temperature of 100-160 degree Celsius.

7. The method according to claim 6, wherein the frame is heated for 2.5 hours at a temperature of 150 degree Celsius.

8. The method according to claim 1, wherein at the step of (4), the LED light module is baked in an oven for 1-5 hours at a temperature of 120-160 degree Celsius.

9. The method according to claim 8, wherein the LED light module is baked for 4 hours at a temperature of 150 degree Celsius.

10. The method according to claim 1, wherein at the step of (3), a die template is used, which has a plurality of mold in a shape of peanut: a plurality of the frame is secured into the die template, while each mold covers on one frame with the LED chip upward into the cavity; the die template is grasped by a holder; silicon resin is pressed into and fully filled in each mold at a pressure of 0.1-0.6 Mpa.

11. The method according to claim 8, wherein at the step of (4), the die template is put in a baker together with the assembled frame and is heated to a temperature of 100-160 degree Celsius for 1-3 hours, then release the LED module from the holder and die template, and heat the same at a temperature of 120-160 degree Celsius for 1-5 hours, and the LED light module is finally obtained.

* * * * *